United States Patent [19]

Iwai

[11] Patent Number: 5,256,593
[45] Date of Patent: Oct. 26, 1993

[54] METHOD OF MAKING ISOLATION STRUCTURE IN SEMICONDUCTOR INTEGRATED CIRCUIT DEVICE

[75] Inventor: Masaaki Iwai, Yokohama, Japan

[73] Assignee: Kabushiki Kaisha Toshiba, Kawasaki, Japan

[21] Appl. No.: 955,456

[22] Filed: Oct. 2, 1992

[30] Foreign Application Priority Data

Oct. 3, 1991 [JP] Japan ................................ 3-281910

[51] Int. Cl.⁵ .......................................... H01L 21/76
[52] U.S. Cl. ...................................... 437/70; 437/67; 437/231; 437/63; 148/DIG. 50
[58] Field of Search ............... 437/67, 70, 231, 63; 148/DIG. 50, DIG. 86

[56] References Cited

U.S. PATENT DOCUMENTS 5,192,714 3/1993 Suguro et al. ...................... 437/195

FOREIGN PATENT DOCUMENTS

| 0022647 | 1/1986 | Japan | 437/67 |
| 0048935 | 3/1986 | Japan | 437/67 |
| 0281747 | 11/1989 | Japan | 437/67 |
| 0161727 | 6/1990 | Japan . | |

Primary Examiner—Brian E. Hearn
Assistant Examiner—Trung Dang
Attorney, Agent, or Firm—Banner, Birch, McKie & Beckett

[57] ABSTRACT

For making an isolation region on a semiconductor substrate without forming an unwanted bird beak, after forming an insulating film on the semiconductor substrate, the substate surface is covered with a resist mask. An LPD $SiO_2$ film is deposited on the unmasked portion of the substrate surface, using a hydrofluoric acid solution containing silicon dioxide so as to be supersaturated. Thereafter, the mask is removed from the substrate surface. Further, after a groove is formed in the semiconductor substrate, it may be filled with the LPD $SiO_2$ film to provide the isolation region in the substrate.

18 Claims, 7 Drawing Sheets

METHOD OF MAKING ISOLATION STRUCTURE IN SEMICONDUCTOR INTEGRATED CIRCUIT DEVICE

BACKGROUND OF THE INVENTION

1. Field of the Invention

The present invention relates to a method of making an isolation structure in a semiconductor integrated circuit device.

2. Description of the Related Art

Figure 5A:
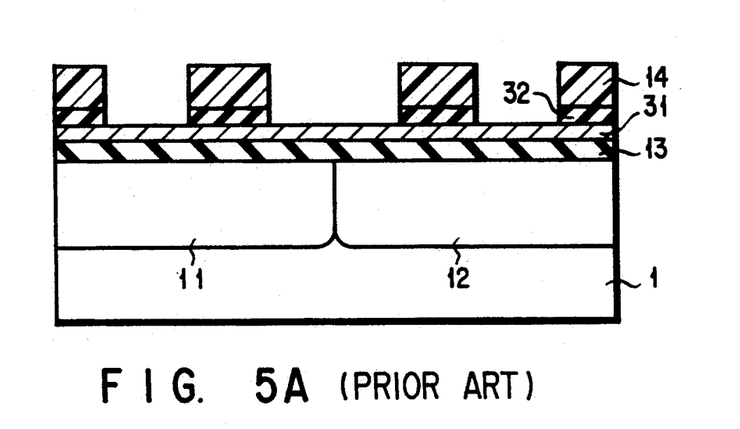
FIGS. 5A to 5C are sectional views showing a conventional process for making an isolation region.
Figure 5B:
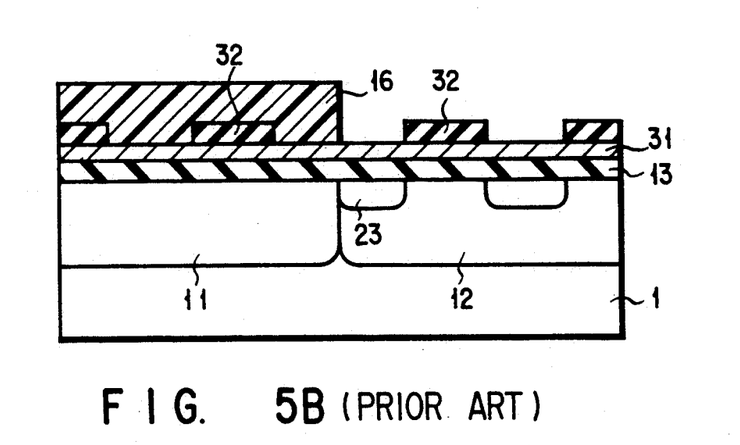
Figure 5C:
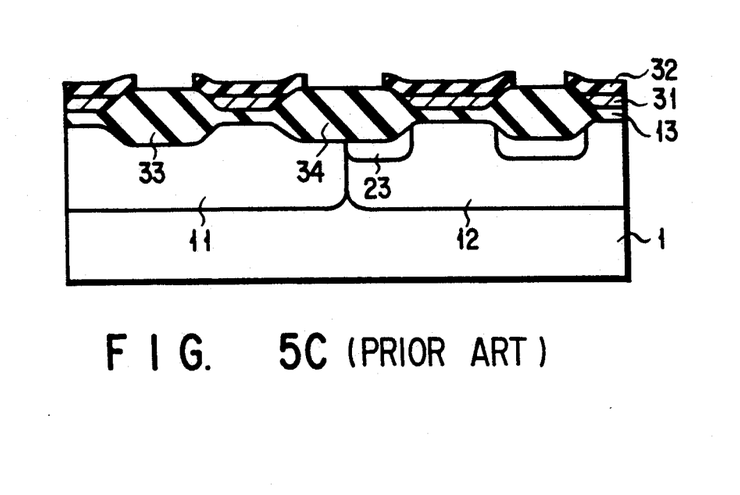

An element isolation technique is one of important techniques for forming a semiconductor integrated circuit such as an LSI and a VLSI. More specifically, a size of a memory cell in a memory device having a large capacity is affected by a dimension of the isolation region, and the size of the cell depends greatly on the distance between elements. At present, LOCOS (Local oxidation of silicon) is known well as an isolation technique, and a method of making the isolation structure will be described below with reference to FIGS. 5A to 5C. Phosphorus and boron are ion-implanted into, e.g., an N-type silicon semiconductor substrate 1 using a photoresist film as a mask. Thereafter, the N-type silicon semiconductor substrate 1 is annealed to form an N-type well 11 and a P-type well 12 therein. As shown in FIG. 5A, after an oxide film 13 is formed on the semiconductor substrate 1 to a thickness of about 1,000 Å, a polysilicon film 31 and a silicon nitride ($Si_3N_4$) film 32 are sequentially deposited on the oxide film 13. Using a resist pattern 14 for masking element regions, the silicon nitride film 32 is selectively etched. As shown in FIG. 5B, after the resist pattern 14 is removed, a resist pattern 16 for masking the N-type well 11 is formed. Boron is ion-implanted into the resultant structure, using the resist pattern 16 and the silicon nitride film 32 remaining on the P-type well 12 as masks so as to form P+-type diffusion layers 23. These diffusion layers 23 are provided to prevent the formation of an unwanted N-channel parasitic transistor. After the resist pattern 16 is removed, the resultant structure is heat-treated at about 1,000° C. to activate the diffusion layers 23. In addition, as shown in FIG. 5C, the semiconductor substrate 1 is heat-treated at about 1,000° C. while the silicon nitride film 32 covers the element regions, so that an isolation oxide film 33 is formed in the exposed regions. The thickness of the isolation oxide film 33 is of the order of 6,000 Å to 8,500 Å. As described above, when the semiconductor substrate surface is thermally oxidized while the element regions is masked by using the silicon nitride film, the isolation region exposed on the semiconductor substrate is oxidized. However, since the oxidation of the silicon semiconductor substrate extends to a portion under the silicon nitride film, an oxide film extension 34, i.e., a so-called bird beak is formed as shown in FIG. 5C. The length of each side of the bird beak reaches about 0.3 μm as shown in FIG. 5C. That is, in FIG. 5A, even if the isolation regions are provided at the maximum resolution of lithography in formation of the resist pattern 14, the length of the isolation region is increased to 0.6 μm after the isolation oxide film is formed. For example, when the maximum resolution of lithography is given by 0.7 μm, the length of the isolation region becomes 1.3 μm or more. This extension of the isolation region caused by the bird beak is serious hindrance to a fine structure of the semiconductor integrated circuit device. In addition, when an oxide film is formed by the thermal oxidation, a large amount of boron contained in the P-type well is added to the oxide film. Therefore, the equivalent amount of boron must be implanted into a layer under the oxide film in advance to activate the layer.

SUMMARY OF THE INVENTION

It is, therefore, an object of the present invention to provide a novel method of making an isolation region in a semiconductor integrated circuit device.

It is another object of the present invention to provide a method of making an isolation region in a semiconductor integrated circuit device without forming a bird beak having a larger length than a mask.

It is still another object of the present invention to provide a method of making an isolation region having a fine structure in a semiconductor integrated circuit device.

According to an aspect of the present invention, there is provided a method of making an isolation region in a semiconductor integrated circuit device without forming an unwanted bird beak, which comprises preparing a semiconductor substrate having an active region to be formed, forming an insulating film over the semiconductor substrate, forming a mask on the insulating film so as to cover the active region therewith, depositing an LPD $SiO_2$ film on unmasked portions of the insulating film by using a hydrofluoric acid solution containing silicon dioxide so as to be supersaturated, and removing the mask from the insulating film to provide a field oxide region on the semiconductor substrate.

BRIEF DESCRIPTION OF THE DRAWINGS

The novel and distinctive features of the invention are forth in the claims appended to the present application. The invention itself, however, together with further objects and advantages thereof may best be understood by reference to the following description an accompanying drawings in which:

DETAILED DESCRIPTION OF THE PREFERRED EMBODIMENTS

Embodiments of the present invention will be described below with reference to the accompanying drawings.

In the following description, the same reference numerals throughout the accompanying drawings denote the same parts.

Figure 1:
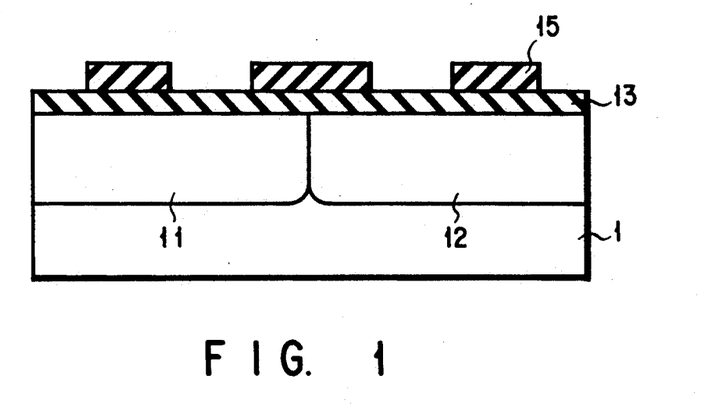
FIG. 1 is a sectional view schematically showing an isolation region in a semiconductor integrated circuit device according to a first embodiment of the present invention.
Figure 2A:
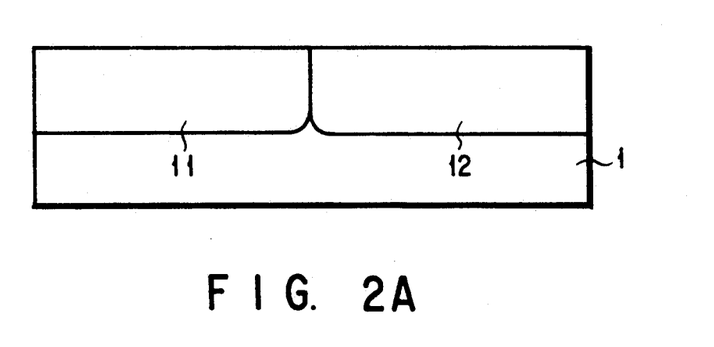
FIGS. 2A to 2D are sectional views showing a process for making the isolation region shown in FIG. 1.
Figure 2B:
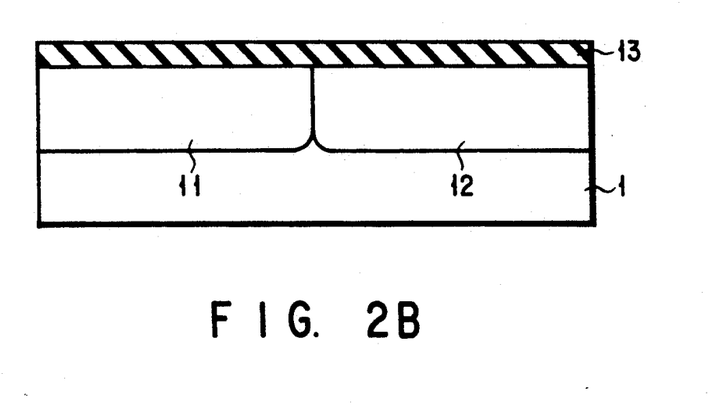

First, the first embodiment of the present invention will be described using FIGS. 1 to 2D. FIG. 1 is a sectional view showing a semiconductor integrated circuit device having isolation regions. That is, the surface of, e.g., an N-type silicon semiconductor substrate 1 having a P-type well 12 and an N-type well 11 is thermally oxidized to cover well regions with an oxide film 13. An oxide film (SiO₂ film) 15 obtained by LPD is formed on the thermal oxide film 13 to provide isolation regions. A process for making the semiconductor integrated circuit device will be described below with reference to FIGS. 2A to 2D. As shown in FIGS. 2A and 2B, boron and phosphorus are sequentially ion-implanted into the semiconductor substrate 1 using a photoresist film (not shown) as a mask, and the resultant structure is annealed to form the P-type well 12 and the N-type well 11 in the semiconductor substrate 1 consisting of, e.g., N-type silicon. In this embodiment, the impurity concentration of the P-type well 12 is high, i.e., $1 \times 10^{17}/cm^3$ or more, and the example shows a semiconductor device, such as memory devices having a CMOS structure driven by a power supply voltage of 3.3 V. For this reason, boron implantation is not performed under the isolation region. Thereafter, the surface of the semiconductor substrate 1 is heat-treated to form the oxide film 13 on the well regions to a thickness of about 1,000 Å.

Figure 2C:
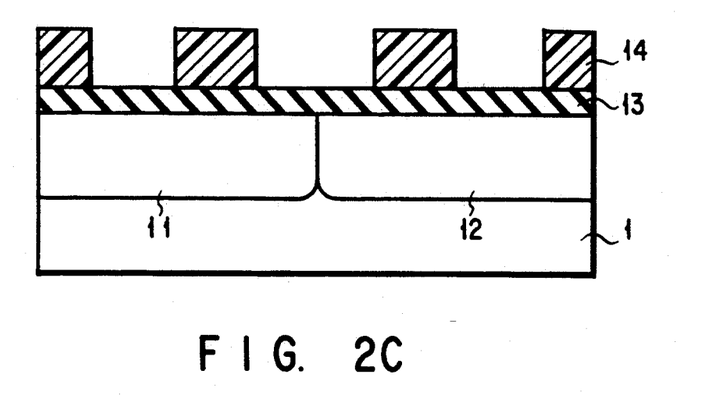
Figure 2D:
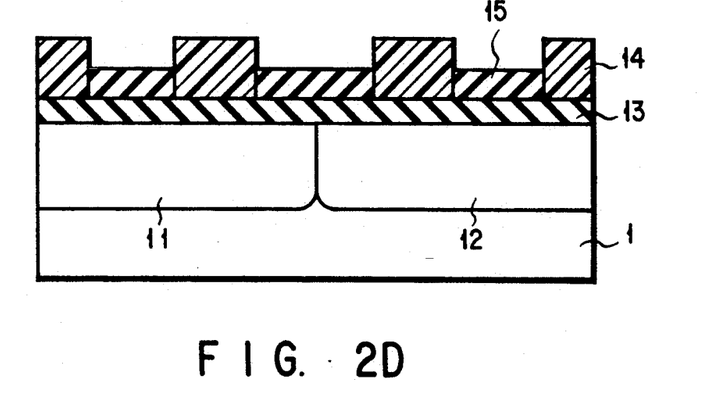

As shown in FIG. 2C, a mask for covering active regions, each of which provides a semiconductor element such as field effect transistor, bipolar transistors, etc., is formed on the semiconductor substrate 1. For example, each of the active regions are covered with a photoresist mask 14. In this state, as shown in FIG. 2D, the LPD SiO₂ film 15 is deposited on the oxide film 13 by LPD (Liquid Phase Deposition) techniques. Since the LPD SiO₂ film does not easily adhere to the photoresist film 14, the SiO₂ film 15 is selectively deposited on only isolation regions. Thereafter, the photoresist film 14 is removed to obtain the isolation regions formed by the LPD SiO₂ film 15. As described above, the LPD SiO₂ film does not adhere to the resist mask. As the material of the resist mask to which the LPD SiO₂ film does not adhere, in addition to the above photoresist film, W, Au, Ti, Pt, Mo, Cr, these nitrides, and these silicides are given, and an organic material such as polyimide may be used. On the other hand, the LPD SiO₂ film easily adheres to a silicon semiconductor substrate and an SiO₂-based material such as a BPSG film and a PSG film. Even if a material to which the SiO₂ film easily adheres is used, the material can be used as the resist mask by covering film does not easily adhere.

The LPD SiO₂ film (to be referred to as an LPD film hereinafter) will be briefly described below. First, silicon dioxide (silica) is added to a hydrofluoric acid until the silicon dioxide is saturated, thereby preparing a saturated solution of silicon dioxide. When Al is added to the saturated solution, the Al reacts with the hydrofluoric acid to produce aluminum fluoride and hydrogen. When the hydrofluoric acid reacts with the Al to be consumed, silicon dioxide becomes excessive in the solution. The solution becomes a hydrofluoric acid solution containing silicon dioxide so as to be supersaturated. The silicon dioxide is deposited from the solution on the substrate surface.

As a means for enhancing the reaction, not only Al but metals such as Fe and Ti and boric acid can be used. The solubility of silicon dioxide to the hydrofluoric acid is increased with a decrease in a temperature. Therefore, if the saturated solution of silicon dioxide is left at a low temperature of, e.g., 25° C. or less, the solution becomes a supersaturated condition, and an SiO₂ film is deposited on the substrate or the like. Although the LPD film is used as an interlevel insulator in the semiconductor device, the solution corrodes Al. For this reason, after an Al wiring layer and the like are covered with a CVD film or a BPSG film, the LPD film is deposited thereon. In addition, since the reaction for forming the LPD film is performed at a low temperature of about 70° C. or less, the LPD film is suitable for manufacturing an integrated circuit which cannot endure a high-temperature treatment. In addition, the LPD film has the good adhesion to the substrate.

After the SiO₂ films 15 obtained by the LPD technique are selectively formed in the isolation regions, the photoresist film 14 is removed by a conventionally known SH solution (solution of H₂SO₄/H₂O₂=3/1). The SiO₂ film formed by the LPD technique, i.e., LPD film, contains a large amount of impurities such as hydrogen and fluorine. For this reason, the SiO₂ film is heat-treated in an nitrogen atmosphere at a temperature of about 900° C. to 1,000° C. for 60 minutes or more, so that an isolation oxide film having excellent insulating properties containing a very small amount of impurities can be formed. In the isolation oxide film formed as described above, the bird beak of the oxide film formed in the prior art does not occur at all, and the isolation regions can be formed in self-alignment with the active regions. For this reason, a fine isolation structure can be provided. Further, in the conventional structure, the impurity of the channel stop, provided under the isolation oxide film of an N-channel transistor, is diffused into the isolation oxide film during the thermal oxidation to reduce the impurity concentration thereof, thereby producing the unwanted parasitic transistor. In order to prevent the parasitic transistor, boron is previously implanted into portions of the isolation regions of the P-type well. However, according to the present invention, since thermal oxidation is not required and the isolation oxide film is thin the boron is not almost diffused into the isolation oxide film. In this case, when the impurity concentration of the P-type well is sufficiently high, it is not necessary to implant the boron into portions of the substrate located under the isolation regions. The thickness of the isolation oxide film is determined by the breakdown voltage of the semiconductor device. When a power supply voltage is given by 1.5 V, the thickness is 3,000 Å; 2.5 V, 4,500 Å; 3.3 V, 6,000 Å; and 5 V, about 8,500 Å, respectively.

Figure 3A:
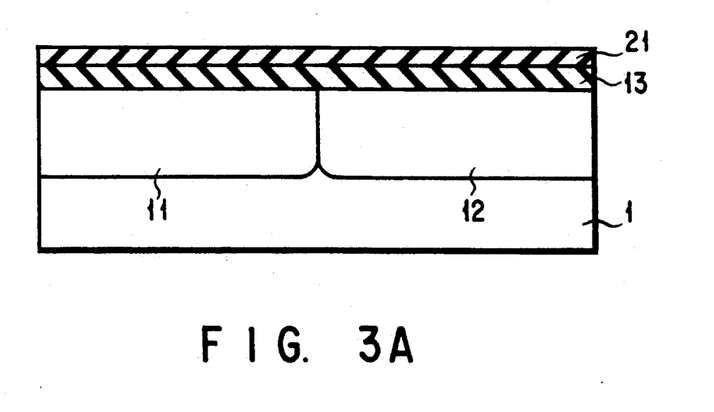
FIGS. 3A to 3I are sectional views showing a process for making an isolation region according to a second embodiment of the present invention.
Figure 3B:
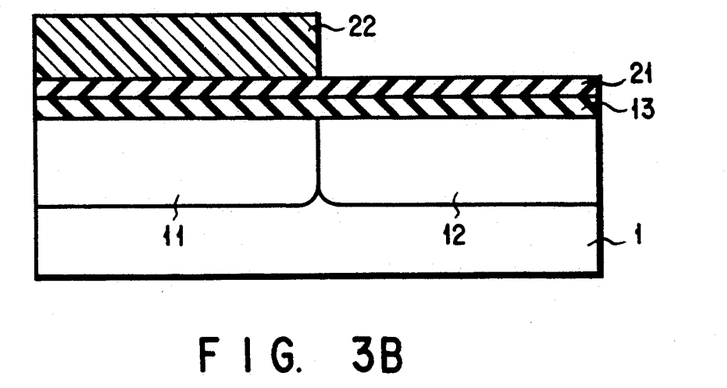
Figure 3C:
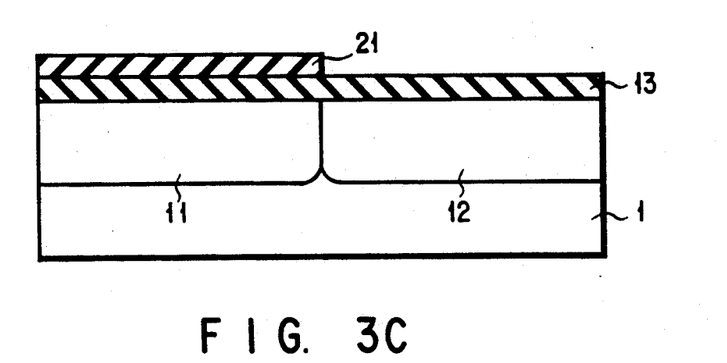
Figure 3D:
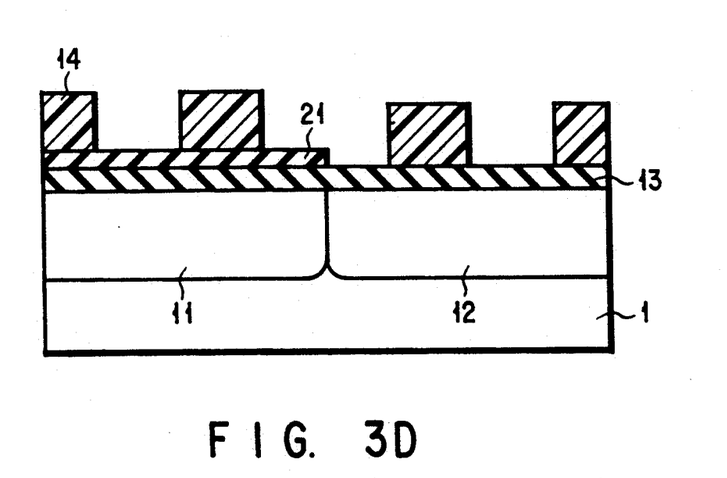
Figure 3E:
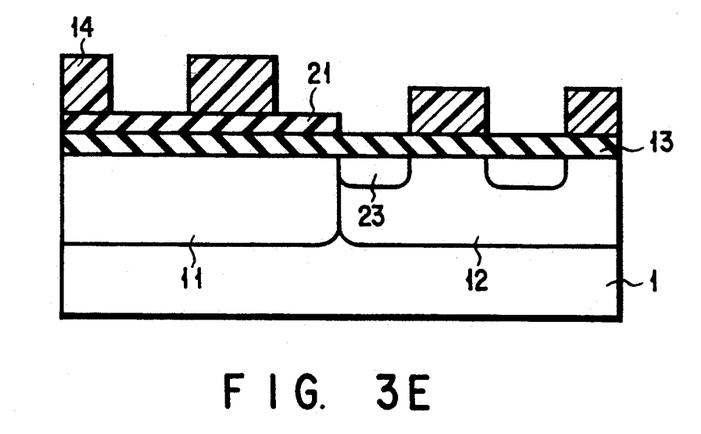

The second embodiment of the present invention will be described below with reference to FIGS. 3A to 3I. The embodiment represents a case where the impurity concentration of the P-type well is not comparatively high. The implantation of boron is required for the portions of the substrate located under the isolation regions. Boron and phosphorus are sequentially ion-implanted into the semiconductor substrate 1 consisting of, e.g., N-type silicon, using a photoresist film (not shown) as a mask, and the resultant structure is annealed to form the P-type well 12 and the N-type well 11 in the semiconductor substrate 1. As shown in FIG. 3A, the surface of the semiconductor substrate 1 is heat-treated to form an oxide film 13 on the substrate surface to a thickness of about 1,000 Å or less. Thereafter, an Si₃N₄ film 21 is deposited on the oxide film 13. As shown in FIGS. 3B and 3C, a photoresist film 22 is formed to mask the Si₃N₄ film 21 on the N-type well 11. The Si₃N₄ film 21 is selectively removed from the P-type well 12. As shown in FIGS. 3D and 3E, after the photoresist film 22 is removed, a photoresist film 14 for masking active regions is formed on the substrate 1. Thereafter, boron is ion-implanted into the P-type well 12 for preventing the formation of an N-channel parasitic transistor, thereby providing impurity diffusion regions 23.

Figure 3F:
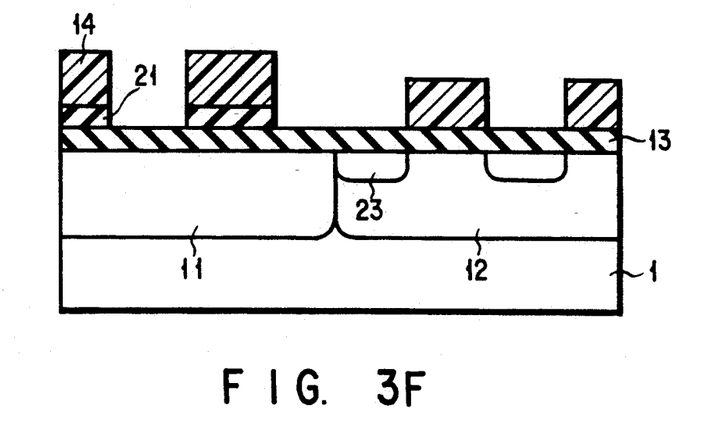
Figure 3G:
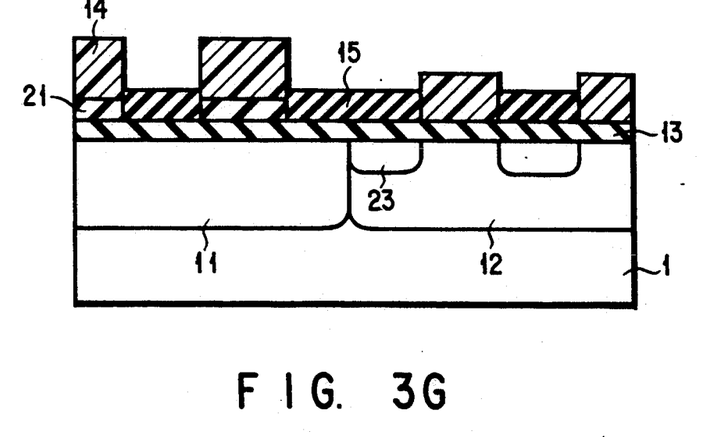
Figure 3H:
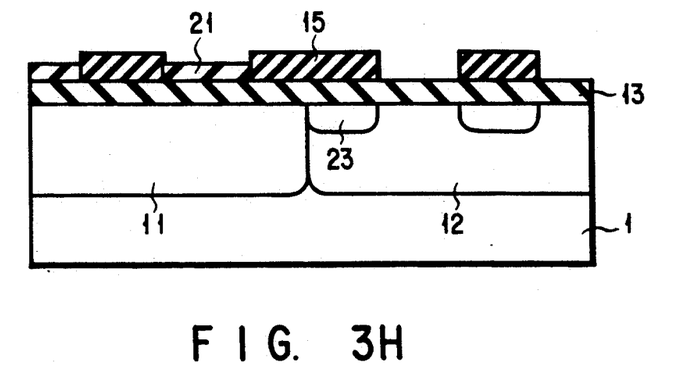
Figure 3I:
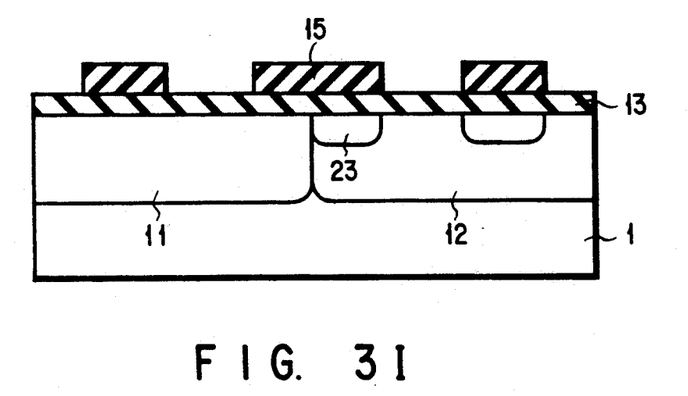

At this time, since the N-type well 11 for providing a P-channel transistor is covered with the $Si_3N_4$ film 21, boron is not ion-implanted into the N-type well 11, and the impurity diffusion regions 23 are formed in only the isolation regions of the P-type well 12. As shown in FIGS. 3F and 3G, the $Si_3N_4$ film 21 exposed on the N-type well 11 is selectively removed by etching. In this state, when the substrate surface is in contact with the supersaturated solution of silicon dioxide which is described in the first embodiment, the LPD film 15 is deposited on the oxide film 13 which is not masked with the photoresist film 14 in each of the isolation regions. Thereafter, as shown in FIGS. 3H and 3I, the photoresist film 14 is removed, and the $Si_3N_4$ film 21 is then removed. The resultant structure is heat-treated in an $N_2$ gas atmosphere at a high temperature of about 1,000° C. for about 60 minutes to improve the quality of the LPD film 15. The boron implanted into the isolation regions is activated by the heat treatment. The isolation region as described above can prevent the occurrence of the N-channel parasitic transistor and has the similar advantages to those described in the previous embodiment.

Figure 4A:
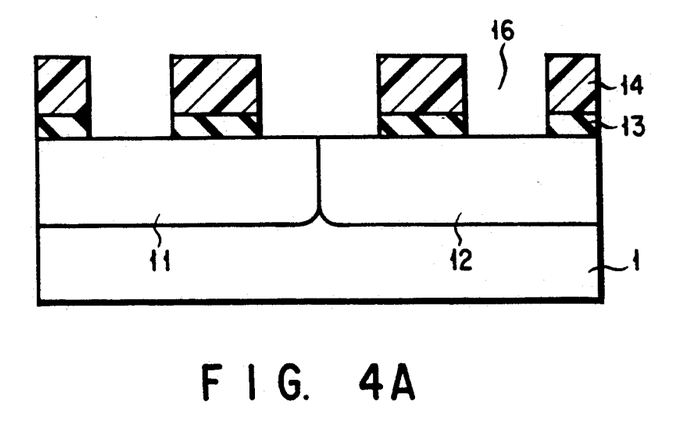
FIGS. 4A to 4D are sectional views showing a process for making an isolation region according to a third embodiment of the present invention.
Figure 4B:
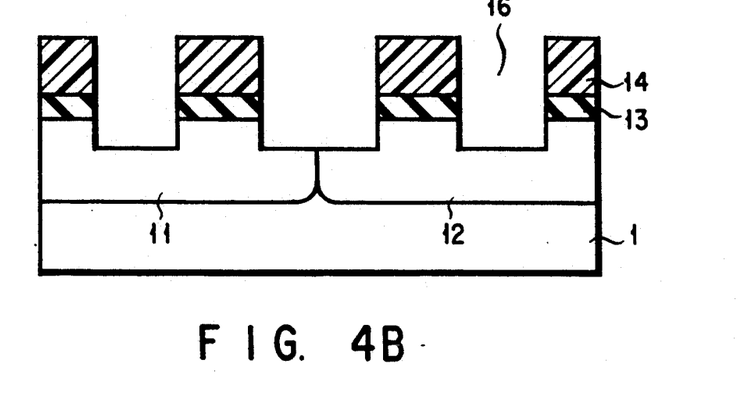
Figure 4C:
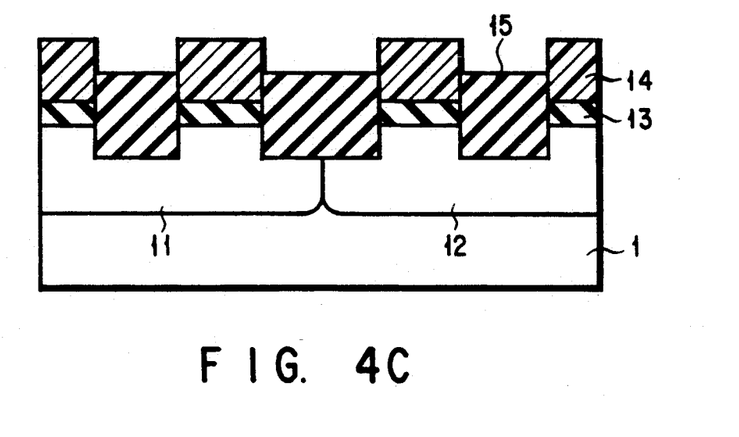
Figure 4D:
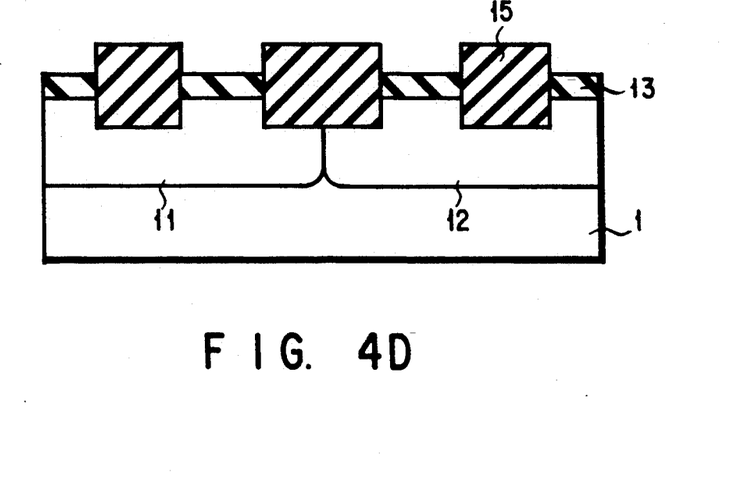

The third embodiment of the present invention will be described below with reference to FIGS. 4A to 4D. As shown in FIG. 4A, boron and phosphorus are sequentially ion-implanted into the semiconductor substrate 1 consisting of, e.g., N-type silicon using the photoresist film as the mask, and the semiconductor substrate is annealed to form the P-type well 12 and the N-type well 11 therein. Thereafter, the semiconductor substrate 1 is heat-treated to form the oxide film 13 on the substrate surface to a thickness of about 1,000 Å or less. A mask for covering active regions is formed on the semiconductor substrate 1. For example, the photoresist film 14 is formed on all the active regions. As shown in FIG. 4B, the exposed oxide film 13 is selectively etched to expose the surface of semiconductor substrate 1 corresponding to each of the isolation regions. Thereafter, the exposed substrate surfaces are etched to form grooves 16. In this case, when anisotropic etching such as RIE is carried out, grooves 16 can be formed to have almost the same configuration as that of the photoresist mask 14. Each of the grooves 16 has a depth of about 3,000 to 4,000 Å. Thereafter, as shown in FIGS. 4C and 4D, the LPD film 15 is grown in each of the grooves 16 by the LPD technique. The LPD film 15 is deposited to a thickness slightly larger than the depth of the groove in consideration of a decrease in the thickness of the LPD film during etching the oxide film performed in the subsequent steps. After the photoresist film 14 is removed, the resultant structure is annealed at about 1,000° C. to provide groove type isolation regions.

According to the method, when an etching amount in the step of etching the oxide film after forming the isolation regions is set to be equal to an extending amount of the LPD film of each of the isolation regions from the substrate, isolation regions without unwanted steps can be formed. Therefore, the method is very effective to planarize the interlevel insulator and to prevent the gate wiring layer from disconnection. The groove structure does not allow the punch-through to occur easily.

As in the second embodiment, if it is impossible to increase the impurity concentration of the P-type well sufficiently, the ion implantation of boron must be performed for the portion of the substrate located under the isolation region of the P-type well. However, as in the third embodiment, when the impurity concentration of the P-type well is low, boron must be ion-implanted into the groove-shaped isolation region of the P-type well as a matter of course.

According to the present invention, the isolation regions of the semiconductor integrated circuit device can be formed in self-alignement with active regions. In addition, since any bird beak is not provided in the isolation regions, the isolation regions having fine structure can be provided, thereby obtaining the semiconductor integrated circuit device having a high integration density.

What is claimed is:

1. A method of making an isolation structure in a semiconductor integrated circuit device comprising the steps of:

preparing a semiconductor substrate having an active region to be formed;

forming an insulating film over said semiconductor substrate;

forming a mask on said insulating film so as to cover said active region therewith;

depositing an LPD $SiO_2$ film on unmasked portions of said insulating film by using a hydrofluoric acid solution containing silicon dioxide so as to be supersaturated; and removing said mask from said insulating film to provide a field oxide region on said semiconductor substrate.

2. The method according to claim 1, wherein said semiconductor substrate includes one conductivity type well and an opposite conductive type well.

3. The method according to claim 1, wherein said mask is composed of a material to which said LPD $SiO_2$ film is difficult to adhere thereto.

4. The method according to claim 3, wherein said material is composed of a photoresist material.

5. The method according to claim 3, wherein said material is selected from W, Au, Ti, Pt, Mo, Cr, these nitrides, and these silicides.

6. The method according to claim 1, further comprising the step of:

heat-treating said LPD $SiO_2$ film remained on said insulating film after removing said mask from said insulating film.

7. The method according to claim 6, wherein said LPD $SiO_2$ film is heat-treated in a nitrogen atmosphere at 900–1000° C. to remove unwanted impurities therefrom.

8. A method of making an isolation structure in a semiconductor integrated circuit device comprising the steps of:

preparing a semiconductor substrate;

forming a well of one conductivity type in said semiconductor substrate;

forming an insulating film over said semiconductor substrate;

forming a mask on said insulating film so as to cover an intended isolation region of said well therewith;

ion-implanting a doping impurity into said intended isolation region through said insulating film;

depositing an LPD $SiO_2$ film on an unmasked portion of said insulating film by using a hydrofluoric acid solution containing silicon dioxide so as to be supersaturated;

removing said mask from said insulating film to provide an isolation region on said semiconductor substrate; and heating said semiconductor substrate to heat-treat said LPD $SiO_2$ film, while activating said doping impurity to provide in said well a diffused region for preventing an unwanted parasitic transistor.

9. The method according to claim 8, wherein said well is a P-type conductivity.

10. The method according to claim 8, wherein said doping impurity is boron.

11. The method according to claim 8, wherein said mask is composed of a photoresist material.

12. A method of making an isolation structure in a semiconductor integrated circuit device comprising the steps of:

preparing a semiconductor substrate having an isolation region to be formed;

forming an insulating film over said semiconductor substrate;

forming a mask on said insulating film so as to cover said isolation region therewith;

forming a groove in said insulating film through said mask down to said isolation region;

depositing an LPD $SiO_2$ film on unmasked portions of said insulating film by using a hydrofluoric acid solution containing silicon dioxide so as to be supersaturated; and removing said mask from said insulating film to provide said isolation region in said semiconductor substrate.

13. The method according to claim 12, wherein said semiconductor substrate includes one conductivity type well and an opposite conductivity type well.

14. The method according to claim 12, wherein said mask is composed of a material to which said LPD $SiO_2$ film is difficult to adhere thereto.

15. The method according to claim 14, wherein said material is composed of a photoresist material.

16. The method according to claim 14, wherein said material is selected from W, Au, Ti, Pt, Mo, Cr, these nitrides, and these silicides.

17. The method according to claim 12, further comprising the step of:

heat-treating said LPD $SiO_2$ film remained on said insulating film after removing said mask from said insulating film.

18. The method according to claim 17, wherein said LPD $SiO_2$ film is heat-treated in a nitrogen atmosphere at 900–1000° C. to remove unwanted impurities therefrom.

* * * * *